United States Patent [19]
Zhao et al.

[11] Patent Number: 5,660,706
[45] Date of Patent: Aug. 26, 1997

[54] ELECTRIC FIELD INITIATED ELECTROLESS METAL DEPOSITION

[75] Inventors: Bin Zhao; Prahalad K. Vasudev, both of Austin, Tex.

[73] Assignee: Sematech, Inc., Austin, Tex.

[21] Appl. No.: 688,466

[22] Filed: Jul. 30, 1996

[51] Int. Cl.$^6$ ............... C25D 5/02; C25D 5/04; C25D 7/12; C25D 17/00
[52] U.S. Cl. ............ 205/123; 205/137; 205/143; 205/147; 205/157; 205/291; 205/182; 204/218; 204/224 R; 204/228; 204/268
[58] Field of Search ................. 205/137, 143, 205/147, 157, 291, 182, 123; 204/224 R, 212, 268, 218, 228

[56] References Cited

U.S. PATENT DOCUMENTS

| | | | |
|---|---|---|---|
| 2,944,945 | 7/1960 | Allison | 204/268 X |
| 3,243,361 | 3/1966 | Clark | 204/268 X |
| 4,043,891 | 8/1977 | Alkire et al. | 204/268 X |
| 4,574,095 | 3/1986 | Baum et al. | 427/53.1 |
| 4,789,648 | 12/1988 | Chow et al. | 437/225 |
| 4,894,260 | 1/1990 | Kumasaka et al. | 427/241 |
| 4,985,750 | 1/1991 | Hoshino | 357/71 |
| 5,151,168 | 9/1992 | Gilton et al. | 205/123 |
| 5,240,497 | 8/1993 | Shacham et al. | 106/1.26 |
| 5,256,262 | 10/1993 | Blomsterberg | 204/268 X |
| 5,372,683 | 12/1994 | Kühn-von Burgsdorff et al. | 204/268 X |

OTHER PUBLICATIONS

"Copper Interconnection with Tungsten Cladding for ULSI;" J.S.H. Cho et al.; VLSI Tech. Symp.; No Month 1991; pp. 39–40.

"Encapsulated Copper Interconnection Devices Using Sidewall Barriers;" Donald S. Gardner et al.; 1991 VMIC Conference; Jun. 11–12, 1991; pp. 99–108.

"Planar Copper–Polyimide Back End Of The Line Interconnections For ULSI Devices;" B. Luther et al; 1993 VMIC Conference; Jun. 8–9, 1993; pp. 15–21.

"Electroless Cu for VLSI;" James S.H. Cho et al.; MRS Bulletin/Jun. 1993; pp. 31–38.

"Electroless Copper Deposition on Metals and Metal Silicides;" Cecilia Y. Mak; MRS Bulletin/Aug./1994; pp. 55–62.

"Development Of An Electroless Copper Deposition Bath For Via Fill Applications On TiN Seed Layers;" Roger Palmans et al.; Conf. Proc. ULSI-X; Materials Research Society; No Month 1995; pp. 87–94.

"Selective and Blanket Electroless Cu Plating Initiated By Contact Displacement For Deep Submicron Via Contact Filling;" Dubin et al.; VMIC Conf.; Jun. 27–29, 1995; pp. 315–321.

(List continued on next page.)

*Primary Examiner*—Donald R. Valentine
*Attorney, Agent, or Firm*—Kidd & Booth

[57] ABSTRACT

A technique for utilizing an electric field to initiate electroless deposition of a material to form layers and/or structures on a semiconductor wafer. The wafer is disposed between a positive electrode and a negative electrode and disposed so that its deposition surface faces the positive electrode. A conductive surface on the wafer is then subjected to an electroless copper deposition solution. When copper is the conductive material being deposited, positive copper ions in the solution are repelled by the positive electrode and attracted by the negatively charged wafer surface. Once physical contact is made, the copper ions dissipate their charges by accepting electrons from the conductive surface, thereby forming copper atoms on the surface. The deposited copper have the catalytic properties so that when a reductant in the solution is absorbed at the copper sites and then oxidized, additional electrons are released into the conductive surface. The formation of the initial layer of copper functions as a seed layer for further electroless growth of copper. The same electroless deposition solution can be used for both the initial activation layer and the additional autocatalytic growth on to the seed layer.

22 Claims, 8 Drawing Sheets

OTHER PUBLICATIONS

"0.35 um Cu–Filled Via Holes By Blanket Deposited Electroless Copper On Sputtered Seed Layer;" Yosi Shacham–Diamand et al.; VMIC Conf.; Jun. 27–29, 1995; pp. 334–336.

"Barriers Against Copper Diffusion into Silicon and Drift Through Silicon Dioxide;" Shi–Qing Wang; MRS Bulletin/ Aug./1994; pp. 30–40.

"Inlaid Copper Multilevel Interconnections Using Planarization by Chemical–Mechanical Polishing;" S.P. Murarka et al.; MRS Bulletin/Jun. 1993; pp. 46–51.

"Electrochemically Deposited Diffusion Barriers;" M. Paunovic; et al.; J. Electrochem. Soc., vol. 141 No. 7; Jul. 1994; pp. 1843–1850.

"Electroless Copper Deposition For Multilevel Metallization;" S. Simon Wong et al.; Mat. Res. Soc. Symp. Proc. vol. 203; 1991 Materials Research Society; pp. 347–356.

"Electroless plating of copper at a low pH level;" R. Jagannathan et al.; IBM J. Res. Develop. vol. 37 No. 2; Mar. 1993; pp. 117–123.

"Selective Electroless Metal Deposition for Integrated Circuit Fabrication;" Chiu H. Ting et al.; J. Electrochem. Soc. vol. 136, No. 2; Feb. 1989; pp. 456–462.

"Selective Electroless Metal Deposition for Via Hole Filling in VLSI Multilevel Interconnection Structures;" Chiu H. Ting et al.; J. Electrochem. Soc., vol. 136, No. 2; Feb./1989; pp. 462–466.

"Pd/Si plasma immersion ion implantation for selective electroless copper plating on SiO2;" M.–H. Kiang et al.; Appl. Phys. Lett. 60(22); Jun. 1, 1992; pp. 2767–2769.

"Selective electroless Ni deposition on a TiW underlayer for integrated fabrication;" V.M. Dubin et al.; Thin Solid Films, 226 No Month (1993); pp. 87–93.

"Copper Corrosion With and Without Inhibitors;" V. Brusic et al.; J. Electrochem. Soc., vol. 138, No. 8; Aug. 1991; pp. 2253–2259.

"100 nm wide copper lines made by selective electroless deposition;" Yosi Shacham–Diamand; J. Micromech. Microeng. 1 (1991); pp. 66–72.

"Passivation of Copper by Silicide Formation In Dilute Silane;" S. Hymes et al.; Conf. Proc. ULSI–VII, Materials Research Society; No Month/1992; pp. 425–431.

"A Half–Micron Pitch Cu Interconnection Technology;" Kazuyoshi Ueno et al.; 1995 Symposium on VLSI Technology Digest of Technical Papers; No Month 1995; pp. 27–28.

"Electroless Metal Deposition From Aqueous Solutions;" V.V. Sviridov; Minsk Bielorussian State University; No Month 1987; pp. 60–85.

ELECTRIC FIELD INITIATED ELECTROLESS METAL DEPOSITION

BACKGROUND OF THE INVENTION

1. Field of the Invention

The present invention relates to the field of semiconductor manufacturing techniques and, more particularly, to a technique for fabricating copper interconnects by electric field initiated electroless metallization.

2. Background of the Related Art

In the manufacture of devices on a semiconductor wafer, it is now the practice to fabricate multiple levels of conductive (typically metal) layers above a substrate. The multiple metallization layers are employed in order to accommodate higher densities as device dimensions shrink well below one micron design rules. Thus, semiconductor "chips" having three and four levels of metallization are becoming more prevalent as device geometries shrink to sub-micron levels.

One common metal used for forming metal lines (also referred to as wiring) on a wafer is aluminum. Aluminum is used because it is relatively inexpensive compared to other conductive materials, it has low resistivity and is also relatively easy to etch. In some instances, aluminum is also used as a material for forming interconnections in vias, instead of tungsten (which is typically the material used for plugs), in order to connect the different metal layers. However, as the size of interconnect structures are scaled down to sub-micron levels, the line-widths of the interconnects become smaller, causing an increase in the current density for the interconnects. As interconnect shrinkage increases, the electromigration lifetime becomes poor for aluminum interconnects.

One approach to providing improved interconnection paths is to utilize a metal which has improved electromigration resistance as compared to aluminum. A material which has received considerable attention as a replacement material for VLSI (Very Large Scale Integration) interconnect metallization is copper. Since copper has better electromigration property and lower resistivity than aluminum, it is a more preferred material for wiring and plugs than aluminum. In addition, copper has improved electrical properties than tungsten, making copper a desirable metal for use as plugs.

One technique for depositing copper, as well as other metals, is electroless deposition. In comparison to other copper deposition techniques, electroless copper deposition is attractive due to the low processing cost and high quality of copper deposited. The equipment for performing electroless metal deposition are relatively less expensive, as compared to other semiconductor equipment for depositing metals, and the technique allows for batch processing of wafers. Thus, overall cost can be reduced by using electroless deposition.

In addition, electroless deposition of copper (as well as other metals), offers an advantage in the selective growth of the metal in an interconnect opening (such as a via opening). Selective growth eliminates the need for a polishing or etching step to remove the excess deposited material. Techniques for selective deposition are known in the art (See for example, "Electroless Cu for VLSI;" James S. H. Cho et al.; MRS Bulletin; June 1993; pp. 31–38; "Selective Electroless Metal Deposition For Integrated Circuit Fabrication;" Chiu H. Ting et al.; J. Electrochem. Soc., 136; 1989; p. 456 et seq.; "Selective Electroless Metal Deposition For Via Hole Filling In VLSI Multilevel Interconnection Structures;" Chiu H. Ting et al.; J. Electrochem. Soc., 136; 1989; p. 462 et seq.; and U.S. Pat. No. 5,240,497).

Electroless deposition of copper is also described in co-pending patent applications "Electroless Cu Deposition On A Barrier Layer By Cu Contact Displacement For ULSI applications;" Ser. No. 08/587,262; filed Jan. 16, 1996; "Selective Electroless Copper Deposited Interconnect Plugs For ULSI applications;" Ser. No. 08/587,263; filed Jan. 16, 1996; and "Protected Encapsulation Of Catalytic Layer For Electroless Copper Interconnect;" Ser. No. 08/587,264; filed Jan. 16, 1996.

However, electroless deposition requires the activation of a surface in order to electrolessly deposit certain metals, such as copper. (See for example, U.S. Pat. No. 4,574,095; "Electroless Copper Deposition on Metals and Silicides;" Cecilia Y. Mak; MRS Bulletin; Aug. 1994; pp. 55–62; and "Development Of An Electroless Copper Deposition Bath For Via fill Applications On TiN Seed Layers;" Palmans et al.; Conference proceedings, ULSI-X, Materials research Society; 1995; pp. 87–94). Accordingly, a variety of techniques are known to activate or make the surface catalytic for subsequent autocatalytic growth of copper. The above-mentioned co-pending applications also describe alternative techniques. In all these instances, some form of surface treatment or activation is required before the surface is made receptive (catalytic) to the autocatalytic growth of the metal, such as copper. For example for copper, a specialized solution is needed for the initial treatment of the surface to make it catalytic and then followed by a separate solution to electrolessly deposit the copper. It would be advantageous if a technique is made available where a single solution can be used for the surface activation as well as for the autocatalytic growth of copper.

Accordingly, the present invention describes a technique of utilizing electroless deposition to form conductive layers and/or structures, in which an electric field is used to initiate the autocatalytic process when the wafer is subjected to an electroless deposition solution.

SUMMARY OF THE INVENTION

The present invention describes a method and apparatus for utilizing an electric field to initiate electroless deposition to form layers and/or structures on a semiconductor wafer. In order to initiate an autocatalytic electroless growth of a material, such as copper, on a conductive surface, the surface must be made receptive to such growth. The present invention initiates the autocatalytic process by using an electric field (E-field) to initiate the attachment of an initial layer of atoms onto the conductive surface to form seed sites for further electroless growth.

The semiconductor wafer is disposed between a positive electrode and a negative electrode. When a material (such as copper) is to be deposited, the wafer is either immersed in an electroless deposition solution or the solution is sprayed on to the surface. The conductive surface which is to receive the electroless deposition is made to face the respective electrode. Once a voltage is applied to the electrodes, the E-field causes the deposition material to deposit along the conductive surface of the wafer facing the respective electrode. Ions in the solution are repelled by the respective electrode and attracted by the charged conductive surface. Ions contacting the surface lose their charge by accepting opposite charges from the conductive surface to form atom sites. The deposited material will have the catalytic properties so that when the reductant in the solution is absorbed at these newly formed sites and then oxidized, additional charges (for example, electrons for copper deposition) are released into the conductive surface. The released charges contribute to further deposition of the material along the conductive surface.

The formation of the initial material deposition sites on the conductive surface provides for a seed layer for further autocatalytic growth of the material. The second step in which the material is electrolessly deposited onto the initial seed layer can be achieved using the same electroless deposition solution, but without the E-field generation.

DETAILED DESCRIPTION OF THE PREFERRED EMBODIMENTS

A technique of utilizing an electric field to initiate electroless deposition of a material on to a conductive layer to form layers and/or structures on a semiconductor is described. In the following description, numerous specific details are set forth, such as specific materials, structures, chemicals, processes, etc., in order to provide a thorough understanding of the present invention. However, it will be appreciated by one skilled in the art that the present invention may be practiced without these specific details. In other instances, well known processes and structures have not been described in detail in order not to obscure the present invention. Furthermore, although the preferred embodiment is described in reference to copper (Cu) deposition, it is appreciated that the copper deposition described is for exemplary purpose only and that the technique of the present invention can be readily adapted to other types of materials, including other metals and alloys.

Additionally, it is appreciated that the fabrication of a multiple-metal layer structure atop a wafer substrate, such as a silicon substrate, to manufacture a semiconductor device is known in the art. Generally, dielectric materials, such as silicon dioxide ($SiO_2$), are utilized to separate the conductive regions. Contact openings are formed in the dielectric overlying the substrate region to provide conductive pathways to the source, drain and gate regions. Via openings are formed in the subsequent inter-level dielectric (ILD) layers separating the various metal layers. Typically, metal and metal alloys are used to provide conductive pathways (plugs and lines) to form the various interconnect structures. One such exemplary multiple metal layer structure is described in "Planar Copper-Polyimide Back End Of The Line Interconnections For ULSI Devices;" B. Luther et al.; 1993 VMIC Conference; Jun. 8–9, 1993; pp. 15–21. Accordingly, it is appreciated that the Figures provided herein illustrate only portions of an exemplary semiconductor device which pertain to the practice of the present invention. Thus, the present invention is not limited to the structures described herein.

In order for copper to be electrolessly deposited onto a surface of a conductive material, such as a conductive layer or a barrier layer, the surface of the conductive material must be made susceptible to the autocatalytic growth of copper. Without such surface treatment, electroless growth of copper will not occur when the wafer is subjected to the electroless copper deposition solution.

One technique is to sputter on catalytic metal, such as copper (see for example, afore-mentioned pending patent application titled "Protected Encapsulation Of Catalytic Layer For Electroless Copper Interconnect;" Ser. No. 8/587,264; filed Jan. 16, 1996. Another technique is by the use of contact displacement to activate the conductive surface. The use of palladium (or palladium seeds) is one known contact displacement technique for treating a surface to start the autocatalytic reaction of copper. (See for example, "Development Of An Electroless Copper Deposition Bath For Via Fill Applications On TiN Seed Layers;" Palmans et al.; Conference Proceedings, ULSI-X; materials Research Society; 1995; pp. 87–94). Another is the technique of using copper contact displacement, which is described in the afore-mentioned co-pending application titled "Electroless Cu Deposition On A Barrier Layer By Cu Contact Displacement For ULSI Applications;" Ser. No. 08/587,262; filed Jan. 16, 1996.

However, these techniques for treating the conductive surface (to activate the surface or to form a seed layer on the surface) requires a separate processing step. Only after the surface is made susceptible to copper growth, is the wafer rinsed and subsequently subjected to an electroless deposition solution. The present invention does not require this separate activation step to pre-treat the conductive surface. Instead, the present invention uses the same electroless solution to deposit an initial copper layer with aid of an electric field and the same solution is used for further autocatalytic growth of copper.

Figure 1:
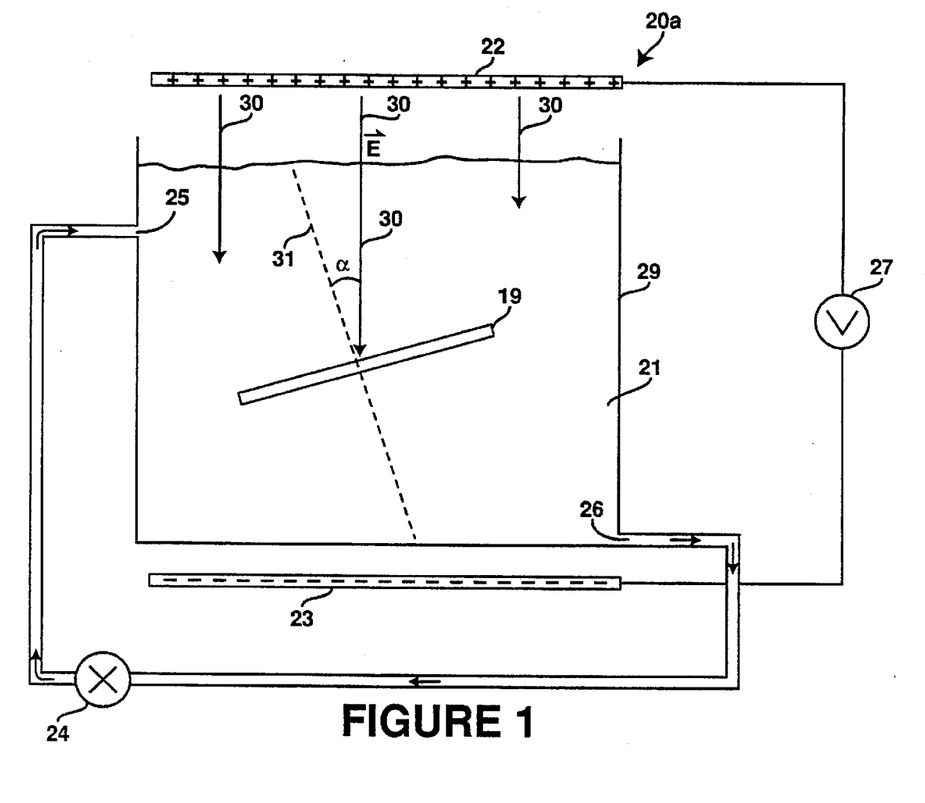
FIG. 1 is a cross-sectional view showing an apparatus of the present invention for immersing a semiconductor wafer in an electroless deposition solution and in which the wafer is disposed between two electrodes.

Referring to FIG. 1, an apparatus 20a for practicing the present invention is shown. Apparatus 20a is comprised of a housing (or container) 29 for holding an electroless deposition solution 21, which solution 21 is disposed between two electrodes 22 and 23. It is preferred to have some form of a circulating mechanism for recirculating the solution 21. As shown, an inlet 25 is located at the upper end of the container 29 and an outlet 26 is located at the bottom of the container 29. The inlet 25 and outlet 26 are coupled to a pump 24 in order to circulate the solution 21. Although not shown, a reservoir can be used as part of the circulating loop for holding additional amounts of the solution. The purpose of the circulation of the solution 21 is to ensure that solution uniformity is maintained when the apparatus 20a is in use.

The electrodes 22 and 23 are coupled to a voltage source 27. The voltage source 27 is made to operate to source a voltage to the electrodes 22–23, such that one electrode has a positive potential relative to the other electrode. In the Figure, electrode 22 is shown as the positive electrode and electrode 23 is shown as the negative electrode. The actual placement of the electrodes is a design choice, but with the embodiment of FIG. 1, the electrodes 22–23 are disposed outside of the container 29, so that a wafer 19 when disposed in the solution 21 resides between the two electrodes 22–23.

The electrodes 22–23 are disposed outside of the container 29 primarily so that the electrodes are not subjected to the electroless deposition solution 21, which will cause the electrodes to deteriorate. However, it is appreciated that electrodes can be disposed within the container 29 and within solution 21. In that instance, it is desirable to encase the electrodes 22–23 in a protective sheath, such as glass or quartz, in order to prevent the solution 21 from coming into actual physical contact with the electrodes 22–23. As is noted by electric field lines (E-field vector) 30, an electric field (E-field) is generated when voltage potential is applied to the electrodes 22–23 by voltage source 27.

The wafer 19 is placed into the solution 21 so that the surface for the copper deposition faces the positive electrode 22. Although not shown, it is understood that the wafer is placed onto a holding mechanism, such as a chuck or a platen, and is not just suspended within solution 21. However, the wafer 19 is positioned so that a vertical axis 31, which is normal to the wafer surface, is tilted at an angle $\alpha$ from the E-field line 30 vector. The reason for this tilt will be described below. Thus, in the preferred embodiment, the surface of wafer 19 is not perpendicular to the E-field lines 30, but at an angle $\alpha$ from the E-field vector.

Also, in the preferred embodiment, it is desirable to move the wafer relative to the electric field lines. The wafer can be rotated in the solution by rotating the wafer chuck. The reason for the rotation of the wafer within the E-field will be described below.

The distance separating the electrodes 22–23 and the potential applied to the electrodes is a design choice dependent on the process being employed. Typical separation distance for the electrodes 22–23 is in the range of several centimeters) to several tens of cm. The maximum voltage applied to the electrodes 22–23 is in the range of 10 volts to several thousand volts. The maximum voltage value will depend on the structure of the apparatus 20, the solution 21, the deposition process and the separation distance of the electrodes 22–23. What is important is that the voltage not exceed a certain value that could potentially cause a chemical breakdown of the solution 21 or damage to the wafer.

Figure 2:
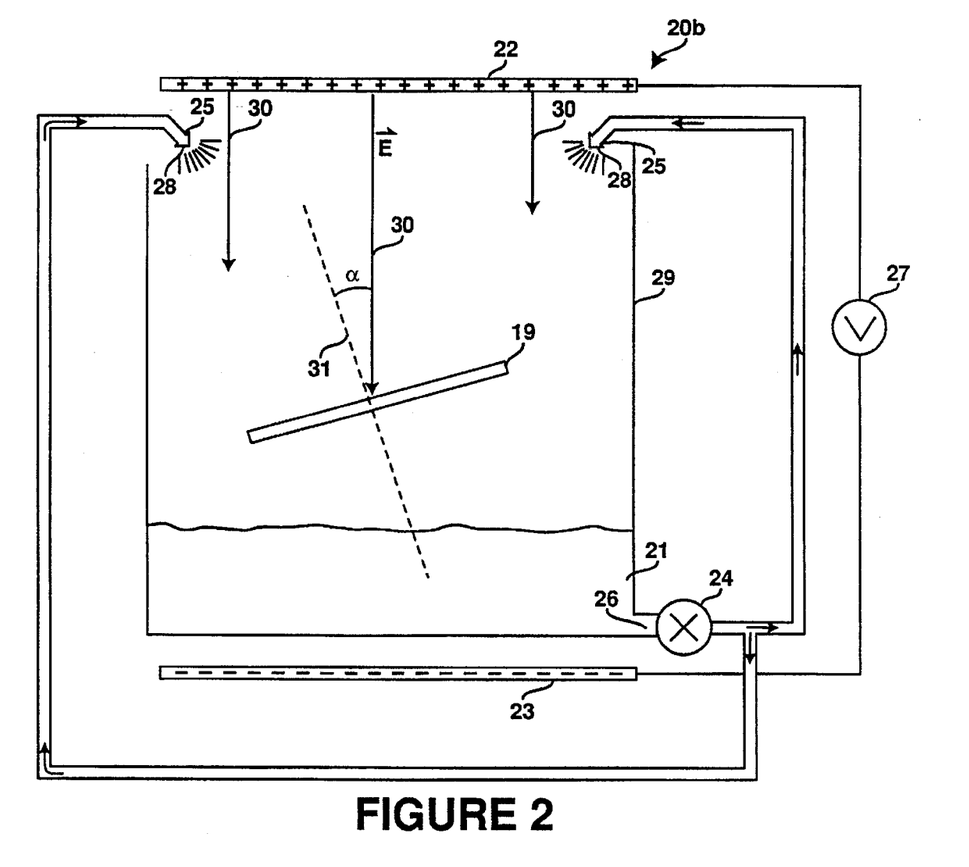
FIG. 2 is a cross-sectional view showing an alternative apparatus of the present invention for spraying an electroless deposition solution onto a semiconductor wafer and in which the wafer is disposed between two electrodes.

Referring to FIG. 2, an alternative apparatus 20b is shown. Apparatus 20b is equivalent to apparatus 20a, except that in this instance the apparatus 20b is not an immersion bath (as was the apparatus 20a of FIG. 1). Apparatus 20b is a shower device in which the electroless deposition solution 21 is sprayed onto the wafer 19. Instead of an inlet, the solution 21 is introduced through a shower head 28 for dispensing onto the surface of the wafer 19 disposed within container 29.

In FIG. 2, two shower heads 28 are shown. The actual number of such shower heads 28 is a design choice. The solution 21 collects at the bottom and is then fed out of outlet 26 for recirculation. The pump 24 is coupled to outlet 26 to recirculate the solution 21 to the shower heads 28. The electrodes 22–23 are shown outside of container 29 in FIG. 2, but it is understood that the electrodes can reside within container 29 as was described for apparatus 20a of FIG. 1. Again, the wafer is tilted from the E-field lines 30 by angle $\alpha$ and the surface of the wafer is rotated relative to the E-field vector.

It is appreciated that either apparatus 20a or 20b (collectively referred to as apparatus 20 herein) can be used to practice the present invention. The choice will be determined by the desirable hardware configuration and the uniformity of deposition achievable by the particular apparatus. As to the shower heads 28, it is preferred that they be constructed from a material which will not interfere with the E-field, if the placement of the shower heads 28 would alter the E-field pattern (if the shower heads had been made from metal). Thus, plastics or other non-conducting materials are preferred for the construction of shower heads 28.

By the use of either version of apparatus 20, the electroless copper deposition solution 21 is made to flow over the surface of the wafer so that electroless copper deposition can occur on the exposed conductive surface portions of the wafer. As noted earlier, with known techniques the conductive surface would need to be treated first for the surface to be receptive to the autocatalytic growth of copper. However, with the practice of the present invention in which electrodes 22–23 subject the wafer 19 to an electric field, the electric field induces a charge on the surface of the conductive layer. As will be described below, the induced charge then initiates the formation of copper sites on the surface and eventually form a copper seed layer, so that autocatalytic growth of copper can occur on this initial seed layer.

It is to be noted that the electroless copper deposition solution 21 can be selected from a variety of known solutions for electrolessly growing copper. Thus, one of a variety of known electroless copper deposition solutions can be utilized to electrolessly deposit copper on wafer 19. However, with the practice of the preferred embodiment, the electroless copper deposition is performed in the following solution. Accordingly, the description of the workings of the invention will also be described in reference to this particular solution.

The electroless solution of the preferred embodiment is comprised of copper sulfate to supply the $Cu^{2+}$ cations, ethylenediaminetetraacetic acid (EDTA) as a complexing agent for $Cu^{2+}$ cations, quaternary ammonium hydroxides to supply the $OH^-$, formaldehyde (HCHO) or glyoxylic acid as a reducing agent, RHODAFAC RE 610 (manufactured by Rhone-Poulenc) or polyethylene glycols as a surfactant and wetting agent, and ammonium cyanide or 2,2"-dipyridyl as stabilizer and ductility promoter.

The particular solution concentration for the solution of the preferred embodiment is mixed in de-ionized (DI) water and is comprised of 0.016–0.08 mol/liter of copper sulfate ($CuSO_4$), 0.04–0.2 mol/liter of EDTA, 0.13–1 mol/liter of formaldehyde, 0.06–0.2 mol/liter of glyoxylic acid, 0.01 mol/liter of ammonium cyanide, 10–120 parts-per-million (ppm) of 2,2'-dipyridyl, 50–100 ppm of polyethylene glycol and 0.01–10 gm/liter of RHODAFAC RE 610. Also, sufficient tetramethylammonium hydroxide (TMAH) is added to adjust the pH of the solution to a range of 11–13. The electroless bath is maintained at a temperature in the range of 30°–80° C. The amount of reducing agent and complexing agent are dependent upon the amount of cupric ions present in the solution. The ratio between the components in the solution can be in molar as:

$$1 \text{ mol } Cu^{2+} : 2 \text{ mol } HCHO : 1 \text{ mol } EDTA^{4-}$$

The above chemical relationship is applicable for the autocatalytic deposition of copper, but the reaction will not occur unless the surface is first made catalytic. The present invention operates as follows to cause the exposed metal (or other conductive) surface to be receptive to the autocatalytic growth of copper without the need for a separate activation solution.

Figure 3:
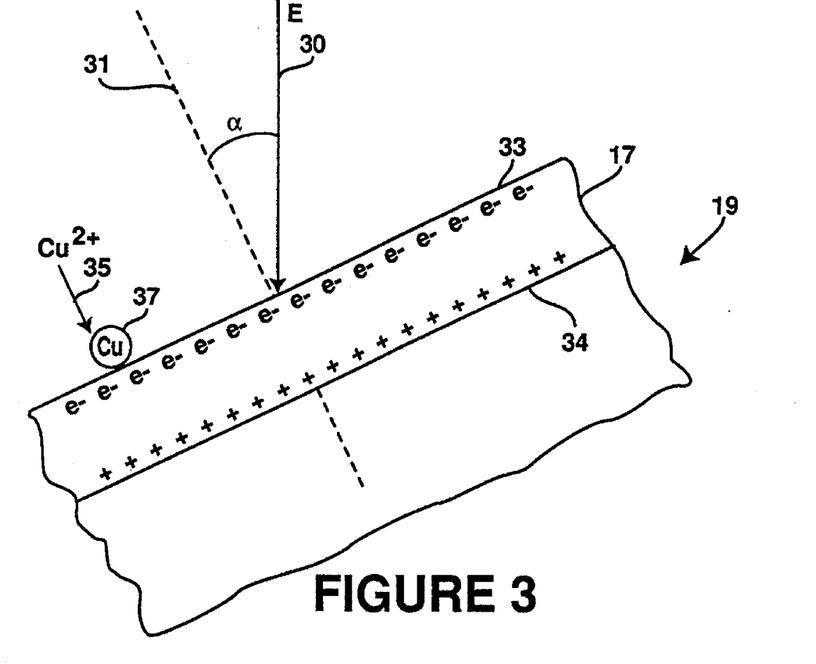
FIG. 3 is a cross-sectional view showing a portion of the semiconductor wafer of FIG. 1 or 2 when subjected to copper deposition, in which a conductive layer on the wafer is subjected to an electric field generated by the electrodes in order to cause ions of copper to be attracted to the conductive surface to form copper sites which function as a copper seed layer.

Referring to FIG. 3, an expanded view of the wafer 19 having an exposed conductive layer 17 is shown. Although conductive layer 17 can be of most conductive layers that can be formed on a semiconductor wafer, it is typically a metal (also metal alloy) forming a base conductive path or a barrier layer disposed thereon. Copper is then to be deposited onto an exposed surface 33 of layer 17. The surface 33 of conductive layer 17 is positioned to face toward a respective electrode, which is the positive electrode 22 in this instance when copper is to be deposited.

When wafer 19 is subjected to the E-field 30, a more positive potential is encountered along the surface 33 than at the opposite surface 34 of the conductive layer 17. Surface 34, being closer to the negative electrode 23, encounters a more negative potential. This potential difference across the conductive layer 17 causes negative charges (electrons) to be attracted toward surface 33 and positive charges to be distributed along surface 34.

With the E-field applied, the $Cu^{2+}$ ions in the electroless solution is repelled away from the positive electrode and attracted toward the negatively charged surface 33 (as shown by arrow 35 in FIG. 3). The $Cu^{2+}$ ion loses its charge by the following reaction when it comes in contact with the negative charges on surface 33.

$$Cu^{2+} + 2e^- = Cu$$

The $Cu^{2+}$ ion loses charges due to a presence of the negative charges along surface 33. The loss of the positive charges causes the $Cu^{2+}$ ion to form a Cu atom 37 on the surface 33. It is appreciated that this Cu formation 37 actually occurs at locations where the conductive layer 17 is exposed, since the conductive surface is needed for the transfer of charges from the $Cu^{2+}$ ion.

Figure 4:
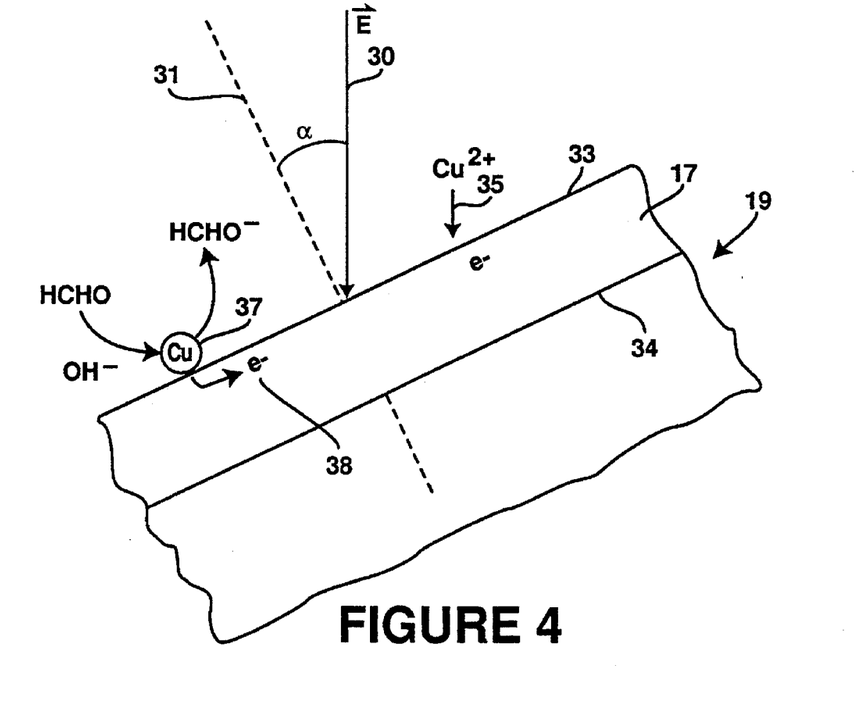
FIG. 4 is a cross-sectional view of the conductive surface of FIG. 3 in which a reductant HCHO oxidizes at copper sites and releases electrons for further copper deposition.

Once some Cu formation 37 occurs along the surface 33, catalytic Cu sites begin to form along surface 33. The deposited Cu formation 37 possesses catalytic properties, so that HCHO and $OH^-$ reactions start to commence. As shown in FIG. 4, the reductant HCHO in the solution is absorbed at the deposited copper 37 site on surface 33 and then oxidized, which causes a release of an electron ($e^-$) 38 to the corresponding conductive layer 17. The equation for this reaction is noted as:

$$2HCHO + 4OH^- \rightarrow 2HCOO^- + H_2\uparrow + 2H_2O + 2e^-$$

The released electron 38 is now resident in the conductive layer 17 and generally reside along surface 33. This electron 38 then contributes a negative charge and further aids in additional $Cu^{2+}$ ions being captured to form further Cu formations 37 along the surface 33.

The electric field is maintained for a sufficient time period until at least a monolayer of Cu atoms are deposited on the exposed conductive material. Once at least a monolayer of copper atoms are present, the E-field is no longer needed. Accordingly, the voltage to the electrodes 22–23 can be reduced to zero. However, if desired, the voltage can be maintained, since it will not have any detrimental effect to the electroless growth of copper.

Once at least a monolayer (seed layer) of copper is formed along the exposed conductive surface 33, the autocatalytic reaction can commence to electrolessly deposit copper atop the copper seed sites 37. The electroless copper deposition reaction noted earlier is applicable for the electroless growth of copper. The copper is electrolessly grown until a desirable thickness is obtained. Then, the wafer 19 is removed from the solution and rinsed, typically in DI water. Thus, it is appreciated that the same electroless solution is used to form seed Cu on the surface of the exposed material, as well as to deposit additional copper onto the seed Cu. The Cu seed formation requires the presence of the electric field, whereas the additional electroless Cu growth atop the seed layer does not.

Figure 5:
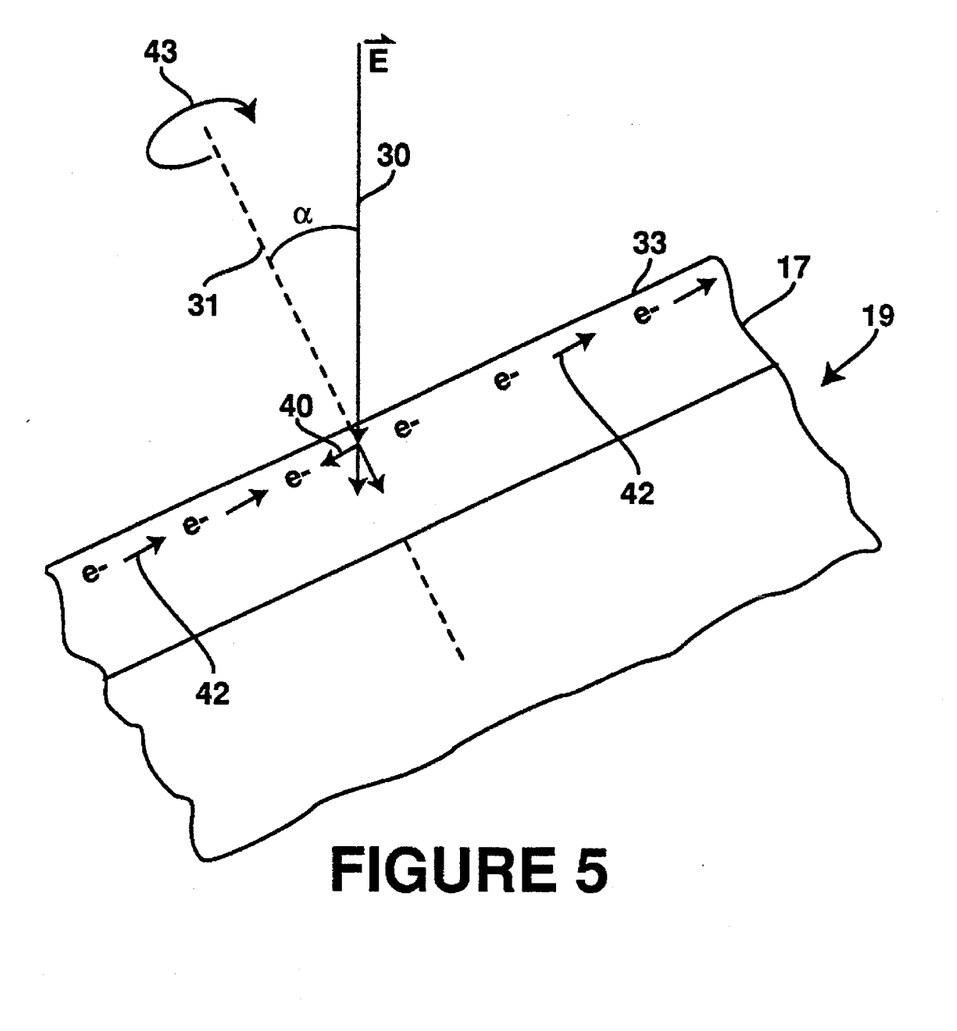
FIG. 5 is a cross-sectional view showing the wafer of FIGS. 3 and 4 in which the tilt and rotation of the wafer enhances electron movement along the conductive surface on the wafer to achieve a more uniform and conformal deposition.

As noted in FIGS. 1–4, the normal axis 31 of the wafer is tilted by an angle $\alpha$ from the E-field vector 30. The reason for this tilt is explained in reference to FIG. 5. Referring to FIG. 5, the wafer 19 is shown having its normal axis 31 tilted the angle $\alpha$ from the E-field vector 30. Because of the tilt angle $\alpha$, there exists an E-field component 40, having a magnitude $E_H$, along the surface 33. Accordingly, the negative charges (electrons) resident on the surface 33 will move due to the component 40, which is constantly changing due to the rotation (illustrated by arrows 43) of the wafer 19. Thus, the negative charges are physically moving all along the surface 33. This movement of electrons ensures that negative charges are not collected into isolated pockets along the surface 33, which may happen if angle $\alpha$ is zero. By ensuring a moving charge across the surface 33, a more uniform and conformal (if there is a structure pattern on the wafer) formation of Cu will occur along surface 33. Formation of a uniform and conformal initial Cu seed layer will ensure a more uniform and conformal electroless deposition of copper during the autocatalytic electroless copper deposition phase.

It is appreciated that the present invention can still be practiced even if the wafer is not tilted and rotated. However, the preferred technique to practice the present invention is to tilt and rotate the wafer. Typically, the range for $\alpha$ is up to 30 degree and the range for the angular speed of rotation of the wafer is 1 to 10 RPM. However, the actual tilt angle and rotational speed is a design choice.

Figure 6:
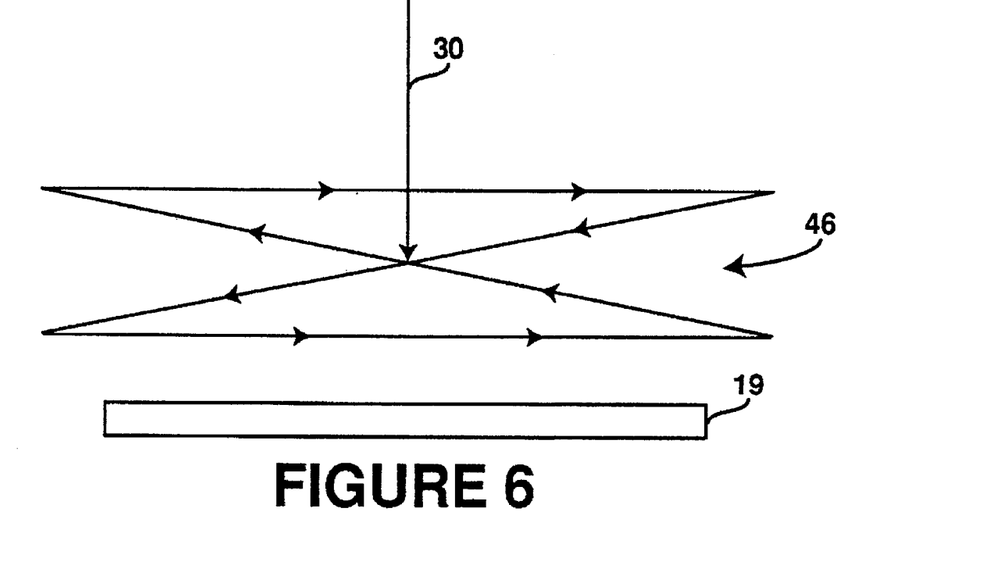
FIG. 6 is a diagram of a moving E-field pattern to achieve electron movement on the conductive surface.
Figure 7:
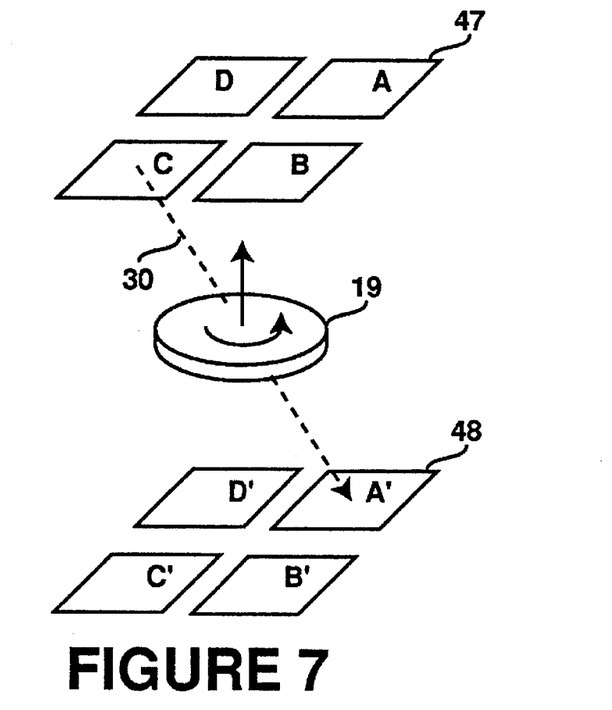
FIG. 7 is a diagram of a multiple-plate electrode design for obtaining a moving E-field of FIG. 6.

Referring to FIGS. 6 and 7, an alternative technique is shown in which the wafer is not physically tilted, but the E-field direction is shifted relative to the wafer. Instead of tilting the wafer, the E-field is made to transition across the wafer surface in a predetermined pattern so as to have the effect of varying the E-field direction along the wafer surface 33 (as shown in FIG. 6). The wafer is placed in the apparatus 20 with α equal to zero. Instead of maintaining a stationary E-field vector, the E-field is made to move in a given pattern. For example, a continuous X-pattern 46 is used to move the E-field vector 30 across the surface of the wafer 19.

Although a variety of techniques can be used to provide for a moving E-field, FIG. 7 illustrates one technique. In FIG. 7, a set of electrode plates are used instead of electrodes 22 and 23 in order to effect a multiple-pole electrode. The wafer 19 is disposed between a set of upper electrode plates 47 and a set of lower electrode plates 48. In the particular example, four upper plates 47 and corresponding lower plates 48 are used. The corresponding electrode plates are denoted by the letters A-B-C-D for plates 47 and A'-B'-C'-D' for plates 48. A result of applying the potential across the plates 47 and 48 can yield various moving E-field patterns, including the X-pattern 46 of FIG. 6. Other electrode configurations and E-field patterns can be employed as well. Furthermore, the wafer can also be rotated if desired. In some instances, the rotation of the wafer 19 within the moving E-field may produce a more uniform deposition.

It is appreciated that the actual technique (whether of tilting the wafer or using a moving E-field) used is a design choice. The rotation of the wafer requires devices within or proximate to the housing for providing the mechanical movement. Such mechanical movement may cause eddy currents in an immersion bath, which could disrupt the uniform growth of copper. The moving E-field approach can remove the requirement for such mechanical movement of the wafer, but complicated circuitry is required to provide for the generation of the moving E-field.

Figure 8:
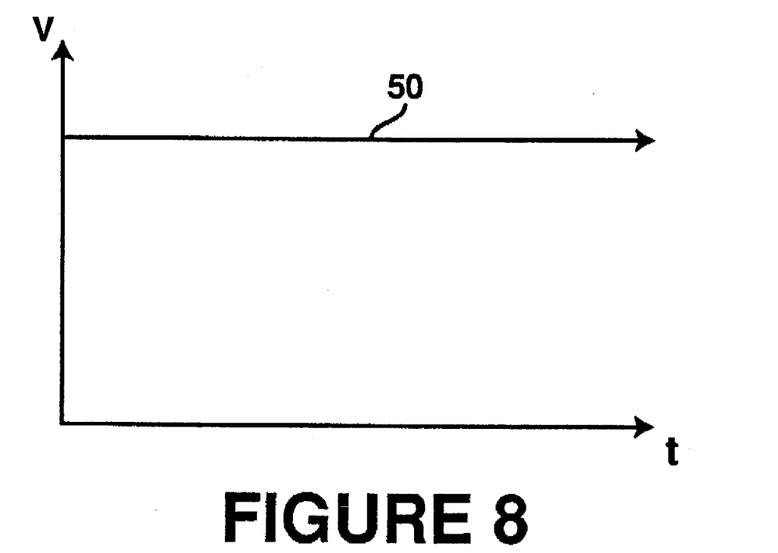
FIG. 8 is a voltage versus time diagram in which a constant voltage amplitude signal is applied to the electrodes.
Figure 9:
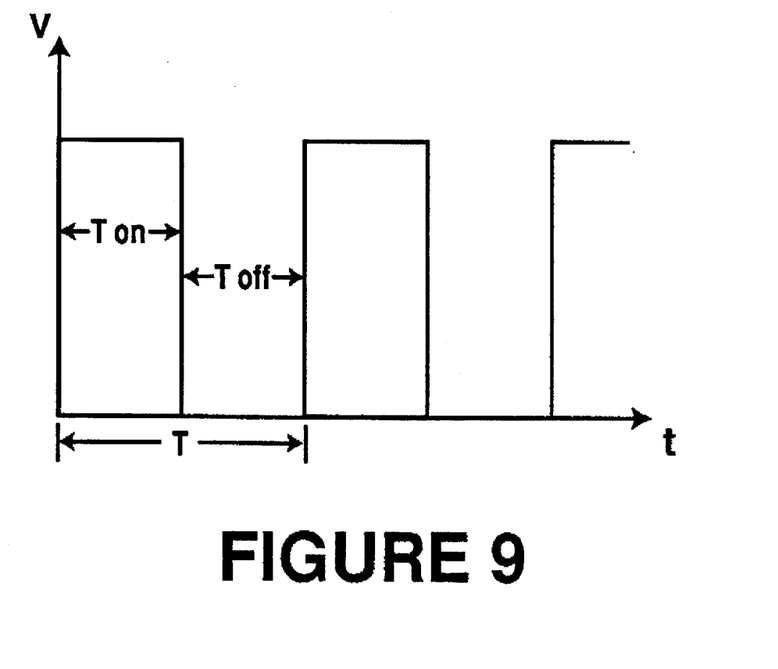
FIG. 9 is a voltage versus time diagram in which a rectangular-wave amplitude signal is applied to the electrodes.

Referring to FIGS. 8 and 9, two possible functions for the voltage potential applied by the voltage source 27 (of FIGS. 1 and 2) are shown. In FIG. 8, the voltage applied to the electrodes has a constant amplitude 50. It is pure direct current (DC). In FIG. 9, the voltage has a step function and in this instance shown as a rectangular-wave. The time period of each cycle T is determined by the on time $T_{ON}$ and off time $T_{OFF}$. This particular function is useful in order to optimize the process parameters depending on the deposition solution, temperature and bath configuration. The $T_{ON}/T_{OFF}$ ratio can be varied accordingly to adjust for this optimization. Typical range for $T_{ON}/T_{OFF}$ is 0.1 to ∞. It is to be noted that when $T_{ON}=∞$ and $T_{OFF}=0$, it is the same as a constant DC potential of FIG. 8.

It is appreciated that although only two separate voltage functions are shown, other functions can be readily substituted for those shown in FIGS. 8–9. Furthermore, the amplitude for $T_{OFF}$ can be made non-zero. In the practice of the present invention, the applied voltage potential across the electrodes is in the range of 10 volts to several thousand volts. A paramount concern is to maintain the voltage at a safe value where it will not cause a chemical breakdown of the solution or damage to the wafer. In practicing the present invention it is preferred to use the voltage function of FIG. 9. The zero E-field potential at $T_{OFF}$ will aid in more OH⁻ molecules to move to the surface by solution circulation or spray for the HCHO oxidation.

Finally, it is appreciated that the electroless deposition solution 21 of the present invention is circulated for a purpose. Since the presence of the E-field in the solution causes positive ions (such as $Cu^{2+}$) to move toward the negative electrode and negative ions (such as $OH^-$) to move toward the positive electrode, there is a tendency for the ions in the solution to not remain uniformly distributed in the solution. Recirculating the solution ensures that the uniformity in solution concentration is maintained.

Figure 10:
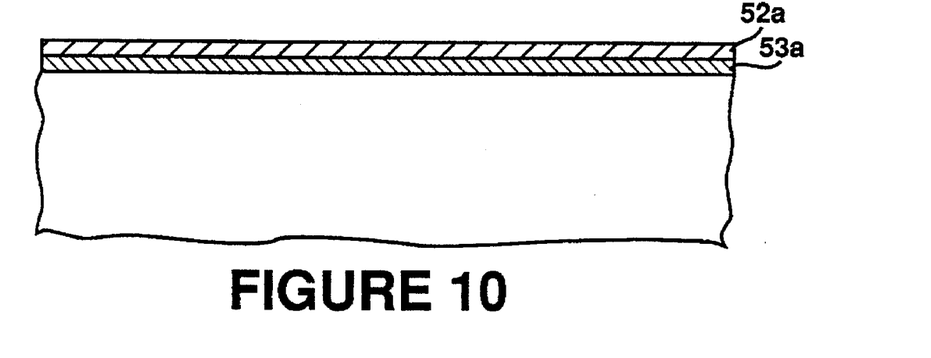
FIG. 10 is a cross-sectional view showing a blanket deposition of electrolessly deposited copper onto a planar conductive surface in the technique of the preferred embodiment.

In practice, the present invention can be utilized to form a variety of layers and/or structures. Examples are noted in FIGS. 10–13. These examples are shown for exemplary purpose only and is not presented for the purpose of limiting the invention. In FIG. 10, the technique of the present invention is used for blanket depositing a copper layer 52a overlying a conductive layer 53a. The layer 53a is typically comprised of metal or metal alloy and is equivalent to the earlier described layer 17. The layer 53a is shown as a planar layer.

Figure 11:
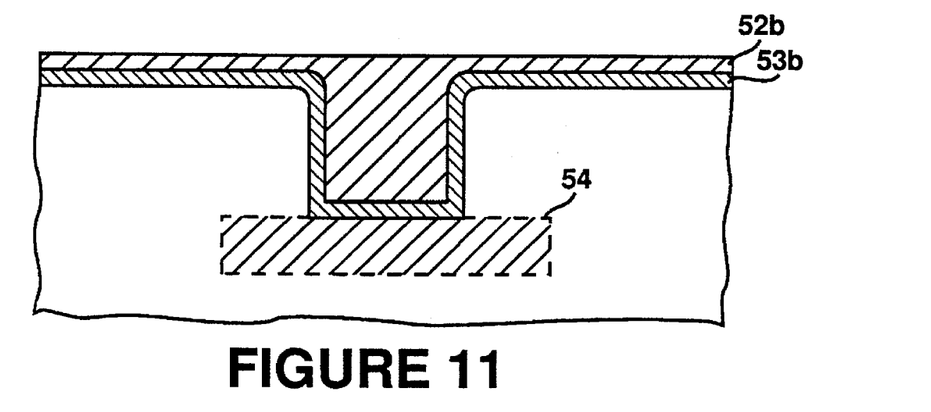
FIG. 11 is a cross-sectional view showing a blanket deposition of electrolessly deposited copper onto a structure having an opening thereon in the practice of the preferred embodiment.

In FIG. 11, a conductive layer 53b is shown as a patterned layer. That is, layer 53b is shown formed into an opening as well as along the upper surface of a base layer (which typically would be a dielectric) and can be used as a barrier layer for Cu diffusion. Then, copper layer 52b is blanket deposited over layer 53b by the practice of the present invention. It is possible that the opening shown is a via opening in which instance there may be an underlying metallization layer (shown by dotted line 54 in FIG. 11).

Figure 12:
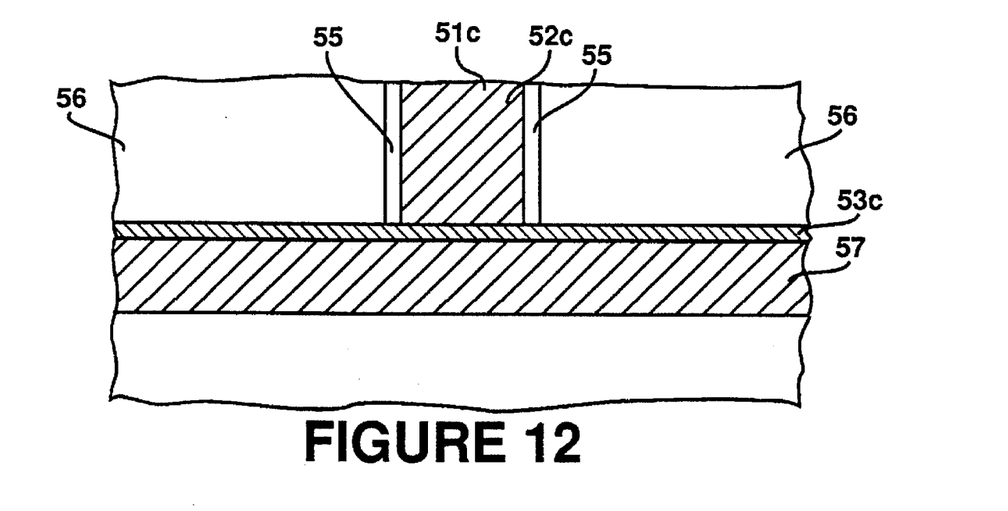
FIG. 12 is a cross-sectional view showing a selective deposition of eletrolessly deposited copper into a via opening of a structure in the technique of the preferred embodiment and in which an underlying barrier layer of an underlying conductive layer is present.

In FIG. 12, copper layer 52c is selectively deposited into an opening 51c. Selective deposition is achieved since the conductive layer 53c is only present and exposed at the bottom of the opening 51c. When Cu is used as an interconnect material, some form of encapsulation technique must be used to encapsulate the Cu to prevent Cu diffusion into the adjacent dissimilar material(s). Accordingly, where Cu is deposited into a via opening, such as opening 51c, some form of encapsulation or diffusion barrier layer 55 will be needed along sidewall regions of opening 51c. Typically, the adjacent material is a dielectric, such as silicon dioxide. The use of the encapsulation layer 55 as a barrier layer along sidewall regions prevents the migration of copper into a dielectric layer 56.

A variety of known techniques can be used to deposit and form encapsulation layer 55 along the sidewall regions. One such technique to deposit silicon nitride (SiN) or silicon oxynitride (SiON) as a diffusion barrier along via sidewalls is described in the afore-mentioned co-pending application titled "Selective Electroless Copper Deposited Interconnect Plugs For ULSI applications;" Ser. No. 08/587,263; filed Jan. 16, 1996. In this particular technique, silicon nitride (SiN) or silicon oxynitride (SiON) is blanket deposited by a chemical vapor deposition (CVD) technique and then anisotropically etched to remove the SiN or SiON material on the surface of the wafer and at the bottom of the opening 51c to form the encapsulation layer 55 along the sidewall regions.

Figure 13:
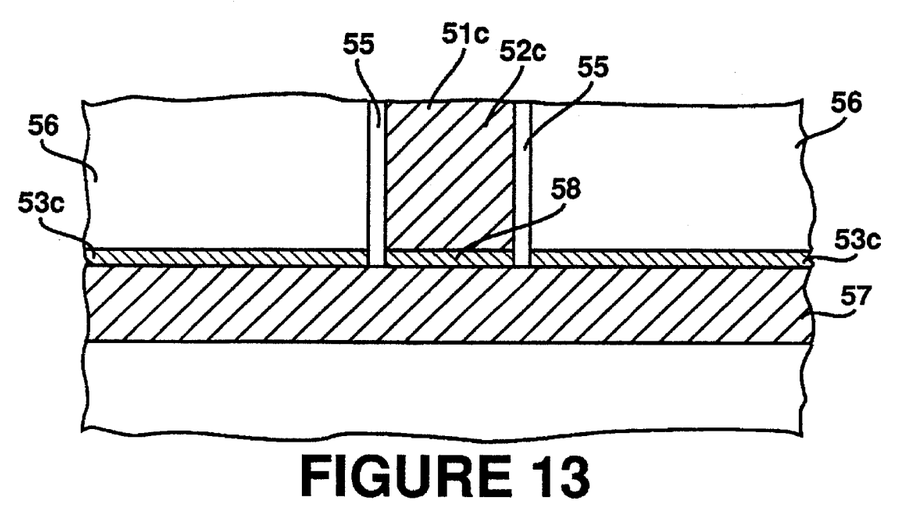
FIG. 13 is a cross-sectional view showing a selective deposition of electrolessly deposited copper into a via opening of a structure in which an underlying barrier layer of an underlying conductive layer in the opening is not present, so that the barrier layer in the opening is first re-formed prior to copper deposition by the technique of the preferred embodiment.

After the formation of the sidewall barriers 55, copper is deposited into the opening 51c by the technique of the present invention. The underlying conductive layer 53c is typically a barrier layer for separating the underlying metal layer 57 from the copper 52c. In the current practice, the underlying metal layer 57 is typically comprised of aluminum. However, in some instances, the underlying barrier metal may be removed, either during the formation of opening 51c or during the formation of sidewall regions 55. Such a condition is shown in FIG. 13. In that event, an additional step is needed to form a new barrier layer 58 (thereby reforming the earlier removed barrier layer 53c) at the bottom of opening 51c, before Cu can be deposited by the technique of the present invention. It is appreciated that the technique of the present invention can be used to deposit the new barrier layer 58 as well.

Accordingly, an electroless copper deposition technique is described in which advantages associated with the use of copper for conductive paths in a semiconductor device are inherently present in the practice of the present invention. The present invention is not limited to a particular conductor width or size of the via or trench opening for interconnects, but does have advantages at smaller sized dimensions in the submicron range. Thus, the practice of the present invention allows higher aspect ratio structures, including interconnects in vias, to be fabricated. The electroless copper deposition can also be performed as a batch process in which a substantial number of wafers can be processed at the same time.

As an added note, it should be emphasized that the present invention is not a technique of electroplating copper. Electrolytic plating of copper has been used to fill geometry of large dimension in printed circuit boards and geometry of small dimension in VLSI fabrication (see for example, U.S. Pat. No. 5,151,168). However, electrolytic plating techniques use the plating surface as one of the electrodes. The voltage is maintained throughout the process. The present invention does not utilize the wafer as one of the electrodes. Rather, the wafer is disposed in an electric field created by two (or more) electrodes. The electric field is utilized for the formation of a copper seed layer in order for the electroless copper deposition to occur. With the present invention, once the seed layer is formed, the autocatalytic copper growth can occur in the electroless deposition solution without the need of the electrodes. Also, selective growth of copper can occur with the practice of the present invention.

Thus, a technique for utilizing electroless deposition to deposit material onto a conductive layer for use in forming semiconductor layers and/or structures is described. Although copper is used as an example in the description, it is appreciated that the apparatus and technique of the present invention can be readily adapted to deposit material, other than copper. The present invention is particularly advantageous to use where one solution is needed for preparing the conductive surface (pre-treating or activating the surface so that an autocatalytic reaction will commence) and where a second solution is needed to deposit (electrolessly deposit by an autocatalytic reaction) the material. Thus, in electrolessly depositing copper, only the electroless deposition solution is needed for both steps to activate and electrolessly deposit copper.

It is appreciated that the electroless deposition solution will be different depending on the material being deposited. Furthermore, although the present invention is described in reference to depositing conductive material for forming interconnects on a semiconductor wafer, it can be readily used for depositing material on a conductive material for other than semiconductor applications.

We claim:

1. A method of depositing a first conductive material onto a second conductive material by electroless deposition, comprising the steps of:

placing said second conductive material between a first electrode and a second electrode;

applying a voltage to said two electrodes in order to subject said second conductive material to an electric field generated between said two electrodes;

subjecting a surface of said second conductive material to an electroless deposition solution, which includes ions of said first conductive material;

moving said electric field to have a moving pattern across said second conductive material;

said electric field causing said ions of said first conductive material in said solution to be attracted to said surface of said second conductive material;

said ions contacting said surface and losing their ionic charges to charges of opposite polarity distributed along said surface to form deposition sites of said first conductive material on said second conductive material.

2. A method of depositing a metallic material onto a conductive layer formed on a semiconductor wafer by electroless deposition, comprising the steps of:

placing said wafer between a first electrode and a second electrode;

applying a voltage to said two electrodes in order to subject said conductive layer to an electric field generated between said two electrodes;

subjecting a surface of said conductive layer to an electroless deposition solution, which includes ions of said metallic material;

said electric field causing said ions of said metallic material in said solution to be attracted to said surface of said conductive layer;

said ions contacting said surface and losing their ionic charges to charges of opposite polarity distributed along said surface to form deposition sites of said metallic material on said conductive layer.

3. The method of claim 2 further including the step of tilting said surface of said conductive layer at an angle so that said surface is not perpendicular to a direction of said electric field, in order to cause movement of charges of opposite polarity distributed along said surface to achieve a more uniform deposition of said metallic material.

4. The method of claim 3 further including the step of rotating said wafer within said electric field, in order to cause further movement of said charges of said opposite polarity.

5. The method of claim 2 further including the step of moving said electric field to have a moving pattern across said surface of said conductive layer, in order to cause further movement of said charges of said opposite polarity distributed along said surface to achieve a more uniform deposition of said metallic material.

6. A method of depositing copper onto a conductive layer formed on a semiconductor wafer by electroless deposition for forming a copper deposit on said wafer, comprising the steps of:

placing said wafer between a first electrode and a second electrode;

applying a voltage to said two electrodes in order to subject said conductive layer to an electric field generated between said two electrodes;

subjecting a surface of said conductive layer to an electroless deposition solution, which includes copper ions;

said electric field causing said copper ions in said solution to be attracted to said surface of said conductive layer;

said copper ions contacting said surface and losing their ionic charges to electrons distributed along said surface to form deposited copper sites on said conductive layer.

7. The method of claim 6 wherein said solution further includes a reductant which when reacting with copper atoms formed on said surface oxidizes and causes additional electrons to be released to reside within said conductive layer, said additional electrons contributing to further formation of said copper sites on said surface.

8. The method of claim 7 further including the step of autocatalytically depositing copper using said electroless deposition solution to deposit additional copper onto said copper sites formed on said surface.

9. The method of claim 8 wherein said autocatalytic depositing of copper is achieved without the use of said electric field.

10. The method of claim 9 wherein said deposited copper forms a copper interconnect structure on said semiconductor wafer.

11. The method of claim 8 wherein said deposited copper forms a copper interconnect structure on said semiconductor wafer.

12. The method of claim 7 further including the steps of tilting said wafer at an angle so that said wafer is not perpendicular to a direction of said electric field and rotating said wafer within said electric field, in order to cause movement of said electrons distributed along said surface to achieve a more uniform deposition of said copper.

13. The method of claim 7 further including the step of moving said electric field to have a moving pattern across said surface of said wafer, in order to cause further movement of said electrons distributed along said surface to achieve a more uniform deposition of said copper.

14. An apparatus for depositing a first conductive material onto a second conductive material by electroless deposition comprising:

a first electrode;

a second electrode, wherein an electric field is generated there between by said two electrodes;

a housing for containing said second conductive material and an electroless deposition solution which includes ions of said first conductive material, said housing coupled between said two electrodes and within said electric field;

a field shifting means coupled to said first and second electrodes for shifting said electric field to have a moving pattern across said second conductive material;

said electric field causing said ions of said first conductive material in said solution to be attracted to a surface of said second conductive material;

said ions contacting said surface and losing their ionic charges to charges of opposite polarity distributed along said surface to form deposition sites of said first conductive material on said second conductive material.

15. An apparatus for depositing a metallic material onto a conductive layer formed on a semiconductor wafer by electroless deposition comprising:

a first electrode;

a second electrode, wherein an electric field is generated there between by said two electrodes;

a housing for containing said wafer and an electroless deposition solution which includes ions of said metallic material, said housing coupled between said two electrodes and within said electric field;

said electric field causing said ions of said metallic material in said solution to be attracted to a surface of said conductive layer;

said ions contacting said surface and losing their ionic charges to charges of opposite polarity distributed along said surface to form deposition sites of said metallic material on said conductive layer.

16. The apparatus of claim 15 further including a wafer platen coupled to said housing for supporting said wafer and wherein said platen is tilted at an angle so that said wafer is not perpendicular to a direction of said electric field, in order to cause movement of charges of opposite polarity distributed along said surface to achieve a more uniform deposition of said metallic material.

17. The apparatus of claim 16 further including a rotating means coupled to said platen to rotate said wafer within said electric field, in order to cause further movement of said charges of said opposite polarity.

18. The apparatus of claim 15 further including a field shifting means coupled to said first and second electrodes for shifting said electric field to have a moving pattern across said surface of said conductive layer.

19. An apparatus for depositing copper onto a conductive layer formed on a semiconductor wafer by electroless deposition comprising:

a first electrode;

a second electrode, wherein an electric field is generated there between by said two electrodes;

a housing for containing said wafer and an electroless deposition solution which includes copper ions, said housing coupled between said two electrodes and within said electric field;

said electric field causing said copper ions in said solution to be attracted to a surface of said conductive layer;

said ions contacting said surface and losing their ionic charges to electrons distributed along said surface to form deposited copper sites on said surface.

20. The apparatus of claim 19 further including a wafer platen coupled to said housing for supporting said wafer and wherein said platen is tilted at an angle so that said wafer is not perpendicular to a direction of said electric field, in order to cause movement of said electrons distributed along said surface to achieve a more uniform deposition of said copper.

21. The apparatus of claim 20 further including a rotating means coupled to said platen to rotate said wafer within said electric field, in order to cause further movement of said electrons.

22. The apparatus of claim 19 further including a field shifting means coupled to said first and second electrodes for shifting said electric field to have a moving pattern across said surface of said conductive layer.

* * * * *